(12) United States Patent
Alaus et al.

(10) Patent No.: US 9,087,002 B2
(45) Date of Patent: Jul. 21, 2015

(54) ADDITION/SUBTRACTION HARDWARE OPERATOR, PROCESSOR AND TELECOMMUNICATION TERMINAL INCLUDING AN OPERATOR OF THIS TYPE

(75) Inventors: Laurent Alaus, Grenoble (FR); Dominique Noguet, Saint Simeon de Bressieux (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 386 days.

(21) Appl. No.: 13/512,046

(22) PCT Filed: Nov. 29, 2010

(86) PCT No.: PCT/FR2010/052566
§ 371 (c)(1),
(2), (4) Date: May 25, 2012

(87) PCT Pub. No.: WO2011/064515
PCT Pub. Date: Jun. 3, 2011

(65) Prior Publication Data
US 2012/0263212 A1 Oct. 18, 2012

(30) Foreign Application Priority Data

Nov. 30, 2009 (FR) ...................................... 09 58501

(51) Int. Cl.
*G06F 7/38* (2006.01)
*G06F 17/14* (2006.01)
(Continued)

(52) U.S. Cl.
CPC ......... *G06F 17/142* (2013.01); *H03M 13/3961* (2013.01); *H03M 13/4107* (2013.01); *H03M 13/6508* (2013.01)

(58) Field of Classification Search
CPC ........... G06F 7/5443; G06F 7/57; G06F 7/48; G06F 9/3001; G06F 2207/3828; H03M 13/4107
USPC ........................................................ 708/490
See application file for complete search history.

(56) References Cited

U.S. PATENT DOCUMENTS

| | | | |
|---|---|---|---|
| 5,969,975 A * | 10/1999 | Glass et al. ................... | 708/490 |
| 2003/0105949 A1 * | 6/2003 | Master et al. ................ | 713/100 |
| 2009/0106341 A1 | 4/2009 | Al Adnani | |

FOREIGN PATENT DOCUMENTS

EP     1 758 030 A1    2/2007

OTHER PUBLICATIONS

U.S. Appl. No. 13/511,672, filed May 24, 2012, Alaus, et al.
(Continued)

*Primary Examiner* — Tan V. Mai
(74) *Attorney, Agent, or Firm* — Oblon, McClelland, Maier & Neustadt, L.L.P.

(57) ABSTRACT

An addition/subtraction hardware operator includes a plurality of addition/subtraction hardware modules and a plurality of transmission links between these modules, on one hand, and between inputs and outputs of the operator and these modules, on the other hand, according to a pre-determined structure for performing arithmetical calculations. At least a part of the addition/subtraction hardware modules and at least a part of the links between these modules can be configured by at least one programmable parameter, at least between a first configuration in which the operator finalizes a computation of real parts of fast Fourier transform coefficients, a second configuration in which the operator finalizes a computation of imaginary parts of fast Fourier transform coefficients, and a third configuration in which the operator carries out a computation of path metrics and survivors values of a Viterbi algorithm implementation.

6 Claims, 6 Drawing Sheets

Figure 1:
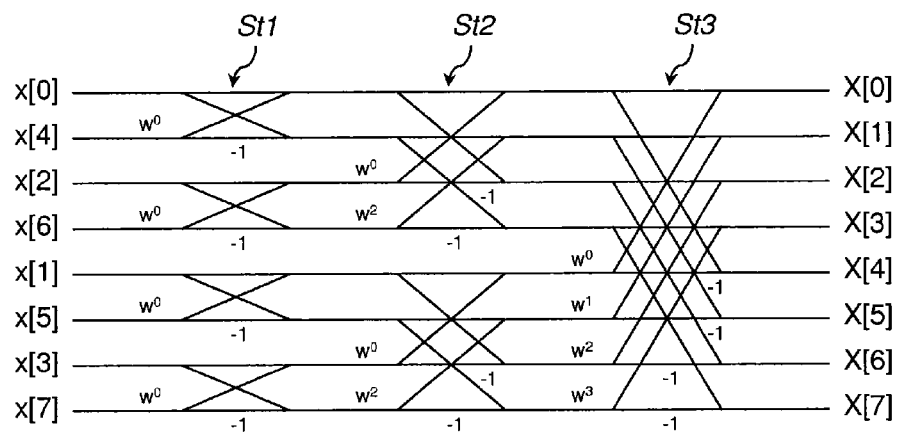

(51) Int. Cl.
  *H03M 13/39* (2006.01)
  *H03M 13/41* (2006.01)
  *H03M 13/00* (2006.01)

(56) References Cited

OTHER PUBLICATIONS

International Search Report issued May 11, 2011, in PCT/FR2010/052566.

Chul Y. Jung, et al., "Design of Reconfigurable Coprocessor for Communication Systems", IEEE Workshop on Signal Processing Systems, XP 002602257, Oct. 13-15, 2004, pp. 142-147.

Hendrik Lange, et al., "Reconfigurable Multiply-Accumulate-based Processing Element", Proceedings of the IEEE Workshop on Heterogeneous Reconfigurable Systems on Chip, XP 002541030, Apr. 25, 2002, pp. 1-4.

Yuan-Hao Huang, et al., "A 1.1 G MAC/s Sub-Word-Parallel Digital Signal Processor for Wireless Communication Applications", IEEE Journal of Solid-State Circuits, vol. 39, No. 1, XP 011105699, Jan. 2004, pp. 169-183.

Tian Hangpei, et al., "Gaining Flexibility and Performance of Computing Using Tailored Instruction Set and Reconfigurable Architecture", 2008 International Conference on Multimedia and Ubiquitous Engineering, XP 031263708, Apr. 24, 2008, pp. 324-329.

L. Alaus, et al., "Promising Technique of Parameterization for Reconfigurable Radio, the Common Operators Technique: Fundamentals and Examples", Journal of Signal Processing Signals, XP 002602258, Mar. 14, 2009, 13 pages.

Hyunseok Lee, et al., "A Low Power DSP for Wireless Communications", IEEE Transactions on Very Large Scale Integration (VLSI) Systems, vol. 18, No. 9, XP 002602259, Aug. 25, 2010, pp. 1310-1322.

Malek Naoues, et al., "A Common Operator for FFT and Viterbi algorithms", 2010 13$^{th}$ Euromicro Conference on Digital System Design: Architectures, Methods and Tools, XP 008129260, Sep. 2010, pp. 309-313.

Laurent Alaus, et al., "Architecture reconfigurable pour un équipement radio multistandard", Thèse Doctorat, http://tel.archives-ouvertes.fr/docs/00/53/86/31/PDF/These__Laurent__Alaus__1.pdf, Version 1, XP 002634880, Nov. 25, 2010, 3 pages.

* cited by examiner

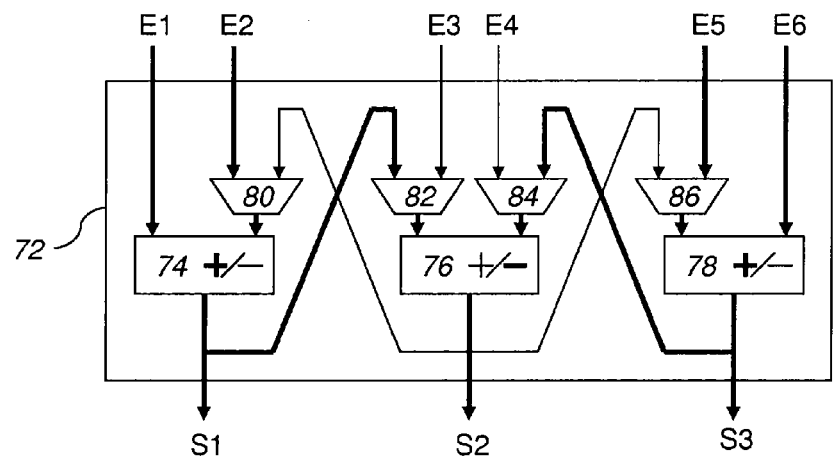
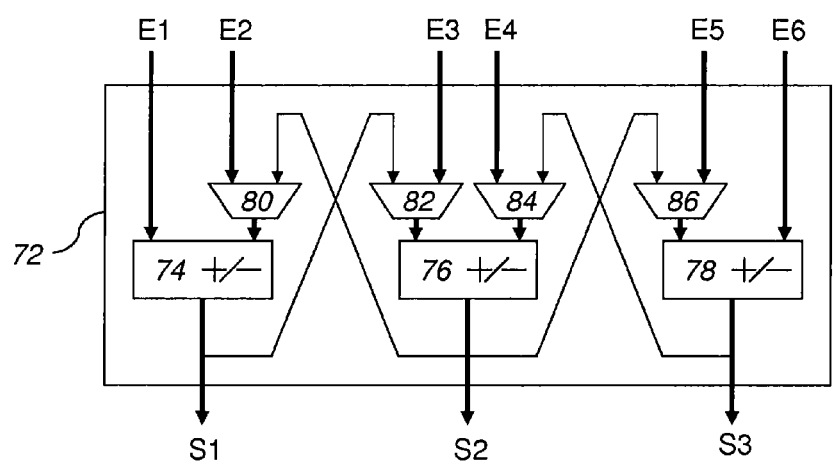

ADDITION/SUBTRACTION HARDWARE OPERATOR, PROCESSOR AND TELECOMMUNICATION TERMINAL INCLUDING AN OPERATOR OF THIS TYPE

This invention concerns an addition/subtraction hardware operator of a pre-determined structure for carrying out arithmetical computations using addition and/or subtraction hardware modules. It also concerns a processor and a telecommunication terminal that includes this hardware operator.

A large number of telecommunication terminals, especially terminals with multi-carrier modulation/demodulation for both received and emitted signals and featuring channel decoding, include digital processing components that generally and advantageously use digital calculations for computations of direct Fast Fourier Transforms (FFT), Inverse Fast Fourier Transforms (IFFT) and a Viterbi algorithm implementation, notably in a software radio or SDR (Software Defined Radio) reconfigurable radio context. However, computing FFT/IFFT and implementing the Viterbi algorithm require specific addition/subtraction operations.

An emitting/receiving SDR terminal is a terminal in which the digital/analog conversion is carried out closest to the antenna, such that modulation/demodulation and coding/decoding processing executed by the terminal is performed on digital signals. These digital signals work better with a reconfigurable process, i.e. one that is capable of adapting to different standards or to different evolutions. Unfortunately, performance and excessive power consumption of processors make it impossible to consider using a pure software solution for digital processing and it is therefore necessary to at least partially resort to the use of hardware.

In this context, addition/subtraction hardware operators are useful in the abovementioned telecommunication terminals, at least for performing FFT/IFFT and Viterbi computations, with the objective of guaranteeing real time functioning. These addition/subtraction hardware operators, having been designed specifically for one application or another, may be used in processors for FFT/IFFT computation, in processors implementing the Viterbi algorithm or in any other processor that executes the processing of arithmetical calculations using addition and/or subtraction hardware modules.

Nonetheless, the proliferation of standards, particularly wireless communications standards, renders compulsory the use of terminals able to manage multiple standards.

One first solution for managing several standards consists in juxtaposing the various processing chains for the considered standards into one single terminal, with each one having its own hardware operators. This solution is simple to put into operation, but presents the major disadvantage of not being efficient in terms of the silicon surface used, in other words, in terms of hardware operators used.

Another solution consists in conceiving the various processing chains in such a manner that they pool a part of their functional modules and hardware operators. This second solution calls for parameterization of the terminal to reconfigure it so that executing one processing chain or another requires only a single change in parameter values. In particular, a common operator technique is presented in an article by L. Alaus and others, titled "Promising Technique of Parameterization for Reconfigurable Radio, the Common Operators Technique: Fundamentals and Examples", published in the Journal of Signal Processing Systems, DOI 10.1007/s11265-009-0353-04, 14 Mar., 2009.

As an example, this article argues that a FFT/IFFT computation hardware operator can be advantageously used in common because it is solicited by a large number of standards. Indeed, most current or in progress telecommunications standards are based on Orthogonal Frequency Division Multiplexing (OFDM) type modulations. OFDM modulation is a coding process for digital signals that divides them into orthogonal frequencies. The principle of OFDM modulation consists in multiplexing a communication by dividing it among sub channels sent simultaneously on independent frequencies. The core of an OFDM modulation contains an FFT calculation.

The FFT operator comes into play more generally as a base operator of signal reception functions in the frequency domain. For example, an FFT operator is used in a frequency implementation of a channel estimate by equalization in a multi-carrier modulation/demodulation and in executing a function known as channelization, i.e. selecting a channel, in a filter bank. This operator can therefore be used at different levels of a processing chain and according to different standards. With this, it is possible to conceive a reconfigurable terminal that features a limited number of hardware operators for FFT computation.

However, this solution is now showing its limitations because within an operator or processor for FFT computation, several addition/subtraction operators with different structures have to be used. For example, addition/subtraction operations involved with calculating real parts of FFT coefficients are not the same as addition/subtraction operations involved in computing imaginary parts.

Furthermore, between an operator or processor for FFT computation and an operator or processor for implementing the Viterbi algorithm, addition/subtraction operations involved are also different and justifiably require distinct hardware modules.

As such, it would be desirable to have an addition/subtraction hardware operator that can at least partially resolve the abovementioned issues and constraints and/or improve the reconfiguration capabilities of a terminal.

An object of the invention is therefore an addition/subtraction hardware operator comprising a plurality of addition/subtraction hardware modules and transmission links between these modules, on one hand, and between inputs and outputs of the operator and these modules, on the other hand, according to a pre-determined structure for performing arithmetical calculations, wherein at least a part of the addition/subtraction hardware modules and at least a part of the links between these modules can be configured by at least one programmable parameter, at least between a first configuration in which the operator finalizes a computation of real parts of fast Fourier transform coefficients, a second configuration in which the operator finalizes a computation of imaginary parts of fast Fourier transform coefficients and a third configuration in which the operator carries out a computation of path metrics and survivors values of a Viterbi algorithm implementation.

By parameterizing the addition/subtraction modules, the links between them and/or the links between these modules and the inputs/outputs of the addition/subtraction hardware operator, a single hardware operator with a pre-determined structure could be conceived that, depending on parameterization, participates in different arithmetic operations that include different phases of an FFT computation and a computation of path metrics and survivors values of a Viterbi algorithm. A same generic hardware operation could therefore be used for several functions, within a same processing operation, to process different operations per the requirements of a common standard or even to process different operations per requirements of different standards.

By ensuring that these processing operations include at least one FFT/IFFT computation and one Viterbi algorithm implementation, we make this generic hardware operator particularly appealing for telecommunication applications, because it reduces the number of installed components in a terminal, notably a mobile, multi-standards terminal. The modulation/demodulation and channel encoding/decoding functions can be accomplished in the same terminal using one or more common generic hardware operators, which limits the number and size of hardware components that need to be placed inside the terminal.

Furthermore, as computations of real and imaginary parts of FFT coefficients are carried out on complex data, the obtained generic processor, which may be configured between these computations and a computation of path metrics and survivors values of a Viterbi algorithm, is capable of processing either hard binary input data or soft data encoded on several bits to accomplish the Viterbi decoding.

Optionally, the addition/subtraction hardware modules and the configurable links can furthermore be configured using the said at least one programmable parameter, in a fourth configuration in which the operator carries out several independent addition and/or subtraction operations and a fifth configuration in which the operator finalizes a cascade of addition and/or subtraction operations.

Also optionally, an addition/subtraction hardware operator according to the invention, can include a first addition/subtraction hardware module that is configurable by means of a first binary parameter between an adder configuration and a subtractor configuration, a second addition/subtraction hardware module that is configurable by means of a second binary parameter between an adder configuration and a subtractor configuration and a third addition/subtraction hardware module that is configurable by means of a third binary parameter between an adder configuration and a subtractor configuration.

Also optionally, an addition/subtraction hardware operator according to the invention may contain:
  a first link for furnishing an operand value to the first configurable module, through a first multiplexing parameter, between a configuration for providing input data of the operator and a configuration for providing the output of the second configurable module,
  a second link for furnishing a first operand value to the second configurable module, through a second multiplexing parameter, between a configuration for providing input data of the operator and a configuration for providing the output of the first configurable module,
  a third link for furnishing a second operand value to the second configurable module, through a third multiplexing parameter, between a configuration for providing input data of the operator and a configuration for providing the output of the third configurable module, and
  a fourth link for furnishing an operand value to the third configurable module, through a fourth multiplexing parameter, between a configuration for providing input data of the operator and a configuration for providing the output of the second configurable module.

Also optionally, each configurable link contains a dual input multiplexer with a single output and with a selection of one of the two inputs using a binary parameter.

The invention also concerns a processor for processing digital data containing at least one butterfly operator including at least one addition/subtraction hardware operator as outlined previously, the butterfly operator being configurable by means of a programmable parameter, between a first configuration in which the butterfly operator carries out a fast Fourier transform computation and a second configuration in which the butterfly operator carries out a computation of branch metrics values and of path metrics and survivors values of a Viterbi algorithm implementation.

Also optionally, a processor for processing digital data according to the invention may contain a plurality of butterfly operators that can be configured between the said first configuration in which each butterfly operator carries out the said fast Fourier transform computation and the said second configuration in which each butterfly operator carries out a computation of branch metrics values and of path metrics and survivors values of a Viterbi algorithm implementation, these butterfly operators being structured among themselves such that they can perform a fast Fourier transform computation by means of a trellis structure Cooley-Tukey algorithmic approach of the Radix 2 type, and a trellis implementation of the Viterbi algorithm with four reference symbols.

Another object of the invention is a telecommunication terminal with multi-carrier modulation/demodulation of both received and emitted signals that decodes signals processed by means of a convolutional code, containing at least one addition/subtraction hardware operator as described previously.

Optionally, the telecommunication terminal according to the invention implements an OFDM modulation/demodulation.

Also optionally, a telecommunication terminal according to the invention may contain at least one modulator/demodulator for OFDM modulation and demodulation compatible with each implemented standard and at least one decoder for signals encoded by a convolutional code compatible with each implemented standard.

Figure 2:
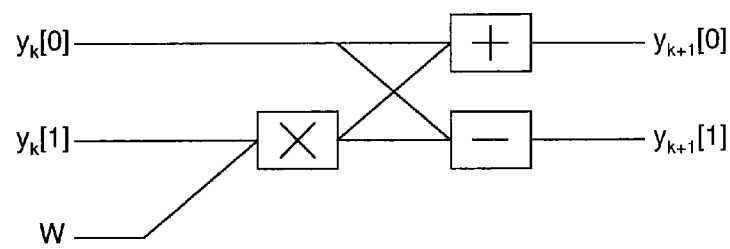
Figure 3:
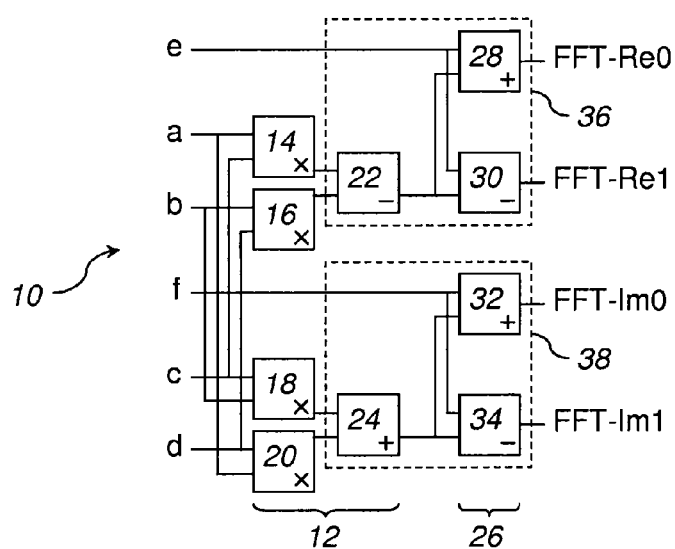
Figure 4:
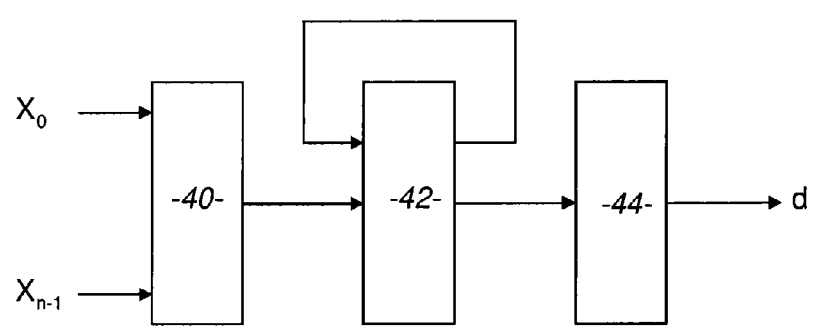
Figure 5:
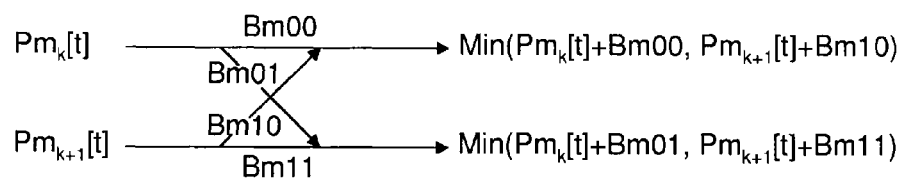
Figure 6:
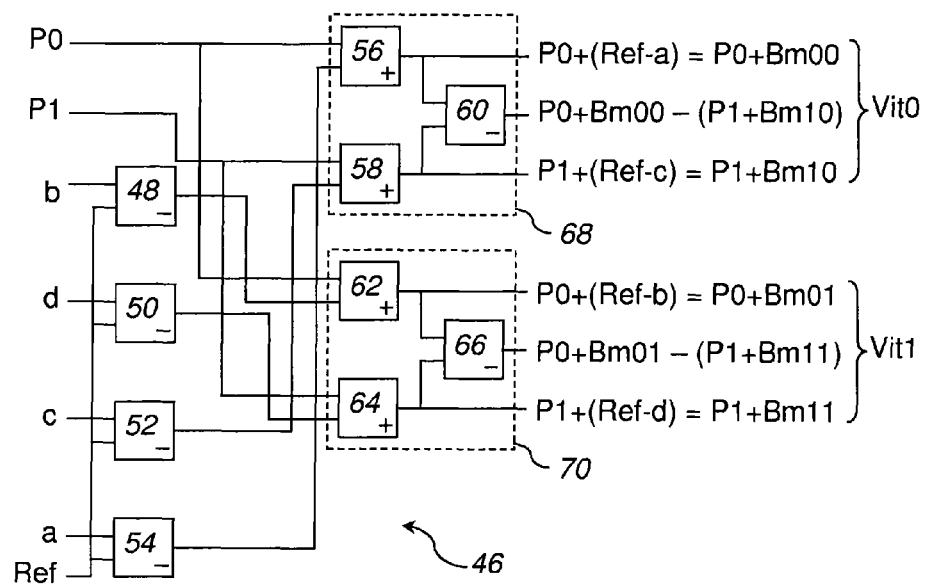
Figure 7:
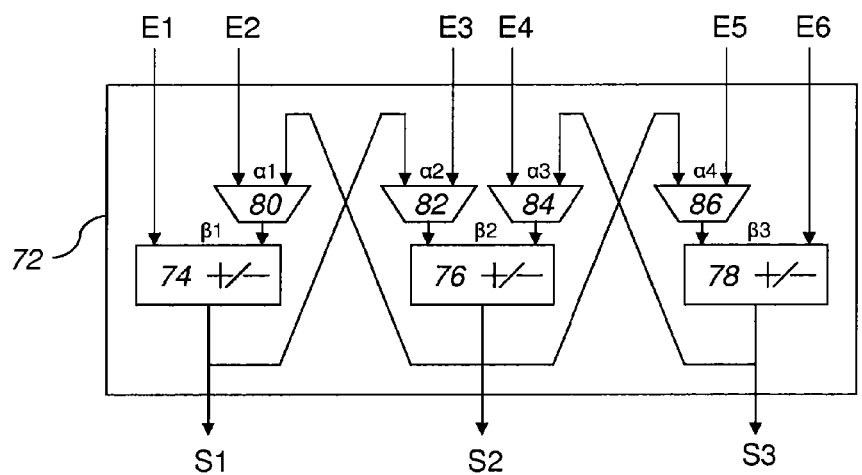
Figure 11:
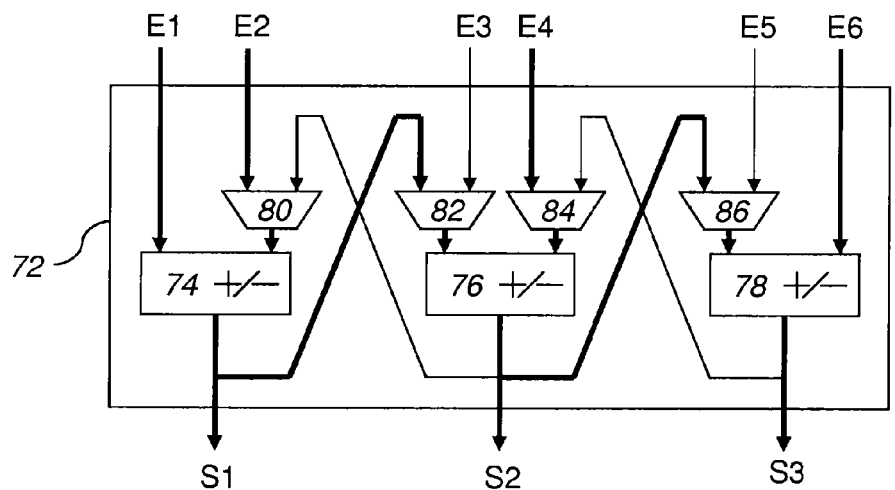
Figure 12:
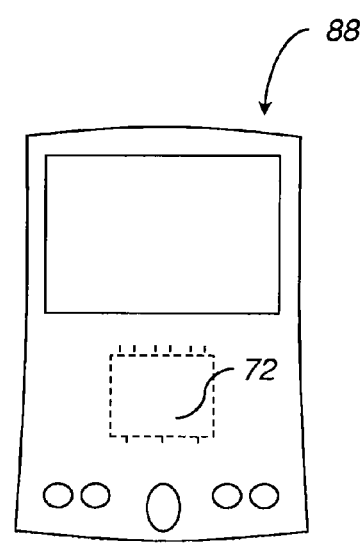

The invention will be better understood with the aid of the following description, which is provided solely for the purposes of providing an example and is done with reference to the appended drawings, as follows:

FIG. 1 is a schematic representation of the overall structure of a data processing trellis system for implementing an FFT/IFFT computation, FIG. 2 schematically represents the structure of a butterfly operator used by the data processing system in FIG. 1, FIG. 3 is a schematic representation of possible implementation with addition/subtraction and multiplication modules of the butterfly operator in FIG. 2, FIG. 4 is a schematic representation of the overall structure of a data processing chain for a Viterbi algorithm implementation, FIG. 5 schematically represents the structure of a butterfly operator used for a part of the data processing chain in FIG. 4, FIG. 6 is a schematic representation of possible implementation with addition/subtraction modules of the butterfly operator in FIG. 5, FIG. 7 schematically represents the overall structure of an addition/subtraction hardware operator according to an embodiment of the invention that can be used in a butterfly operator according to FIG. 3 or 6, FIGS. 8 to 11 represent the addition/subtraction hardware operator in FIG. 7 according to different possible configurations, and FIG. 12 is a schematic representation of the overall structure of a telecommunication terminal according to an embodiment of the invention.

The direct fast Fourier transform is a computation algorithm of the discrete Fourier transform. This algorithm is used to process digital signals to transform discrete data from the temporal or spatial domain to that of frequencies.

Take for example, N discrete temporal values x[0], ..., x[N−1] of a signal x. The N frequency values of discrete Fourier transform X of this signal x are determined through the following formula:

$$X[k] = \sum_{n=0}^{N-1} x[n] \cdot w^{kn}, \text{ for } k = 0, \ldots, N-1, \text{ where } w = e^{-i\frac{2\pi}{N}},$$

As the inverse discrete Fourier transform is equivalent to the direct discrete Fourier transform, apart from a sign and 1/N factor, the inverse fast Fourier transform IFFT uses the same algorithm as the FFT to compute this inverse discrete Fourier transform. Therefore, all processors for processing digital data configured to compute a direct fast Fourier transform FFT are also capable of computing an inverse fast Fourier transform IFFT.

A particularly simple and widely used implementation of the FFT computation is the Cooley-Tukey algorithm using Radix 2 subdivisions. It assumes that the number N of transformed samples is a power of 2 and recursively subdivides the processing of n samples into two identical processing loads of equal size n/2 at a lower step. At a first step, we get:

$$X[k] =$$

$$\sum_{n=0}^{N-1} x[n] \cdot e^{-i\frac{2\pi}{N}nk} = \sum_{n=0}^{N/2-1} x[2n] \cdot e^{-i\frac{2\pi}{N}2nk} + \sum_{n=0}^{N/2-1} x[2n+1] \cdot e^{-i\frac{2\pi}{N}(2n+1)k},$$

$$X[k] = \sum_{n=0}^{N/2-1} x[2n] \cdot e^{-i\frac{2\pi}{N/2}nk} + e^{-i\frac{2\pi}{N}k} \sum_{n=0}^{N/2-1} x[2n+1] \cdot e^{-i\frac{2\pi}{N/2}nk},$$

$$X[k] = \sum_{n=0}^{N/2-1} x[2n] \cdot e^{-i\frac{2\pi}{N/2}nk} + w^k \sum_{n=0}^{N/2-1} x[2n+1] \cdot e^{-i\frac{2\pi}{N/2}nk}$$

On a recurring basis, an FFT computation at a given scale is done through two FFT computations at a lower scale, one for even samples, the other for odd samples of the signal at the given scale.

By using additional well known simplifications, we get a trellis processing at several scales or levels, involving the same number of successive steps, as shown in FIG. 1 for N=8 involving three steps, St1, St2 and St3.

Each step contains N/2 butterfly computations, for a total number of $N/2 \times \log_2(N)$ butterfly calculations, as the one illustrated in FIG. 2. This butterfly computation requires cross calculations of two data $y_k[0]$ and $y_k[1]$, containing a complex multiplication of one of these data, $y_k[1]$, by a factor W to furnish an intermediate value, then complex addition and subtraction between $y_k[0]$ and the intermediate value to provide two data $y_{k+1}[0]$ and $y_{k+1}[1]$. In the example shown in FIG. 1, the W factor equals $w^0$ at step St1, $w^0$ or $w^2$ at step St2 and $w^0$, $w^1$, $w^2$ or $w^3$ at step St3.

The two relationships linking $y_{k+1}[0]$ and $y_{k+1}[1]$ to $y_k[0]$ and $y_k[1]$ take the following form:

$$y_{k+1}[0]=y_k[0]+W \cdot y_k[1],$$

$$y_{k+1}[1]=y_k[0]+W \cdot y_k[1],$$

In practice, the butterfly computation is carried out by an operator structured in an initial complex multiplication stage and a second stage of complex subtraction and addition receiving data output by the first stage. To carry out its complex multiplication, the first stage contains hardware modules for real multiplication, hardware modules for real addition/subtraction and links for data transmission between these modules. To carry out complex addition and subtraction, the second stage contains real addition/subtraction hardware modules and links for data transmission to these modules.

More precisely, noting:

$$y_k[1]=a+ib,$$

$$W=c+id,$$

$$y_k[0]=e+if,$$

Where a, b, c, d, e and f are real values, the need appears for real multiplication, addition and subtraction hardware modules:

$$y_{k+1}[0]=(ac-bd+e)+i(bc+ad+f),$$

$$y_{k+1}[1]=(-ac+bd+e)+i(-bc-ad+f),$$

In this form, the computation carried out by a butterfly operator requires four real multiplication hardware modules, three real addition hardware modules and three real subtraction hardware modules, as represented in FIG. 3.

More precisely, the first stage of complex multiplication of the butterfly operator 10 whis is represented in FIG. 3, having the reference number 12, contains four multiplication modules 14, 16, 18 and 20 that respectively perform products ac, bd, bc and ad, a subtraction module 22 receiving output data from modules 14 and 16 to perform the subtraction of ac−bd and an addition module 24 receiving output data from modules 18 and 20 to perform the addition of bc+ad.

The second complex addition and subtraction stage of the butterfly operator 10, having reference number 26, contains:
an addition module 28 receiving output data from module 22 and the variable e to carry out the operation ac−bd+e, thus providing the real part marked FFt-Re0 of $y_{k+1}[0]$,
a subtraction module 30 receiving output data from module 22 and the variable e to carry out the operation −ac+bd+e, thus providing the real part marked FFt-Re1 of $y_{k+1}[1]$,
an addition module 32 receiving output data from module 24 and the variable f to carry out the operation bc+ad+f, thus providing the imaginary part marked FFt-Im0 of $y_{k+1}[0]$, and
a subtraction module 34 receiving output data from module 24 and the variable f to carry out the operation −bc−ad+f, thus providing the imaginary part marked FFt-Im1 of $y_{k+1}[1]$.

So it can be noted that the three addition and subtraction modules 22, 28 and 30 interconnected with each other make up a first addition/subtraction hardware operator 36 and the three addition and subtraction modules 24, 32 and 34 interconnected with each other make up a second addition/subtraction hardware operator 38 of a similar structure.

The structures of these two addition/subtraction hardware operators 36 and 38, while bearing similarities, differ in that the first operator 36 contains two subtractors 22, 30 and one adder 28, whereas the second operator 38 contains two adders 24, 32 and one subtractor 34.

In other conceivable forms, the computation carried out by an FFT butterfly operator can involve a slightly different structure, but this structure generally includes at least hardware operators 36 and 38 with three interconnected addition/subtraction modules.

FIG. 4 is a schematic representation of the overall structure of a data processing chain for a Viterbi algorithm implementation.

The purpose of this algorithm is to find the most probable sequence of states by recurrence that produces a measured sequence $[X_0, \ldots, X_{N-1}]$ of a signal encoded by a convolutional encoder, i.e. an encoder with a shift register in which each entering bit generates a shift in the register and an output result.

Its principle is to compare each received value with all the possible outputs of the shift register so as to determine what was the most probable shift of this register that generated the received value. Knowing this shift makes it possible to know the value that generated it and consequently the generating value of the received message.

For each received message value, a trellis structure is obtained that transfers all possible states of the shift register on y coordinates and all possible transitions on x coordinates, with the trellis pattern invariably repeating over time at each new encoder input. Only some binary sequences are possible in encoder output. These correspond to the different paths that exist in the trellis diagram.

The Viterbi algorithm is applied then by searching in the trellis for the binary sequence that most resembles the sequence received. In practice, the algorithm sequence contains the following three operations at each instant and for each trellis state:

computation of branch metrics values is done in a unit 40, consisting of calculating, upon reception of N symbols (for a yield of 1/N), values representing the likelihood of symbols received with relation to the possible $2^N$ symbols. These $2^N$ values are called the branch metrics and are noted as Bm00, Bm01, Bm10 and Bm11 for N=2;

calculating path metrics and survivors values is done by a unit 42, consisting of determining the most probable state of the shift register. For each trellis node, a path metric representing the accumulated probability of this node being part of the emitted sequence is updated by acknowledging the path metric calculated in the previous cycle and values of current branch metrics. This update contains the calculation of two path metrics and selects the lowest (survivor path);

memorization of the decision bit taken by a unit 44 in order to restore the decoded signal at the end of frame by a technique of survivors recovery.

Specifically, the unit 40 calculates the difference between a received value and possible outputs of the shift register.

The unit 42 generally known as the Add Compare Select (ACS) unit carries out additions of two path metrics with the branch metrics for each trellis node, a comparison of the two path metrics obtained and a selection of the lowest.

For a computing performed on the basis of four possible branch metrics Bm00, Bm01, Bm10 and Bm11 calculated by the unit 40, we can bring up a butterfly operator such as that shown in FIG. 5 to calculate the following path metrics:

$$Pm_k[t+1]=Vit0=\text{Min}(Pm_k[t]+Bm00, Pm_{k+1}[t]+Bm10),$$

$$Pm_{k+N/2}[t+1]=Vit1=\text{Min}(Pm_k[t]+Bm01, Pm_{k+1}[t]+Bm11),$$

Knowing that the detection of a minimum by comparing two values can be accomplished using a subtractor coupled to a multiplexer, to achieve the calculations in units 40 and 42, which are calculations of branch metrics values, branch path metrics and survivors values of a Viterbi algorithm implementation, we note that the butterfly operator requires:

two addition hardware modules and one subtraction hardware module for each of the calculations of path metrics and survivors values, four additional subtraction hardware modules for calculating the four branch metrics values Bm00, Bm01, Bm10 and Bm11.

In all, ten addition/subtraction hardware modules are used for this butterfly operator, as shown in FIG. 6. If we call the two path metrics calculated in the previous cycle P0 and P1, Ref as the received value and a, b, c and d as the four possible output values, then the butterfly operator 46 shown in FIG. 6 has the following in its first sequential level:

four subtraction modules 48, 50, 52 and 54 to carry out the following operations respectively, Ref-b=Bm01, Ref-d=Bm11, Ref-c=Bm10 and Ref-a=Bm00, And, in its second sequential level:

one addition module 56 receiving output from module 54 and the P0 variable to carry out the P0+Bm00 operation, one addition module 58 receiving output from module 52 and the P1 variable to carry out the P1+Bm10 operation, one addition module 62 receiving output from module 48 and the P0 variable to carry out the P0+Bm01 operation, One addition module 64 receiving output from module 50 and the P1 variable to carry out the P1+Bm11 operation, And, in its third sequential level:

one subtraction module 60 receiving output data from modules 56 and 58 for a comparison of P0+Bm00 and P1+Bm10, to be used to determine the value of Vit0, and one subtraction module 66 receiving output data from modules 62 and 64 for a comparison of P0+Bm01 and P1+Bm11, to be used to determine the value of Vit1.

So we note that the three addition and subtraction modules 56, 58 and 60 interconnected with each other make up a third addition/subtraction hardware module 68 and that the three addition and subtraction modules 62, 64 and 66 interconnected with each other make up a fourth addition/subtraction hardware operator 70 of a identical structure.

This identical structure of the third and fourth operators 68 and 70, while presenting similarities with structures of the aforementioned first and second operators 36 and 38, differ by the interconnections they feature between addition and subtraction modules.

According to the invention a generic addition/subtraction hardware operator of a pre-determined structure that can be configured with at least one parameter is being proposed.

It clearly appears indeed that the structures of the FFT butterfly operator 10 and that of the Viterbi operator 46 involve hardware configurations that make it conceivable that their operators 36, 38, 68 and 70 could be pooled by means of parameterizing certain addition/subtraction modules of these operators and links using multiplexers for example.

This possible pooling, an example of which is shown in FIG. 7, is a result of the fact that the aforementioned two pairs of operators, the pair of operators 36 and 38 on the one hand for the FFT, and the pair of operators 68 and 70 on the other hand for the Viterbi algorithm, contain an identical split of the addition/subtraction modules (2×3) and a systematic link between one of the modules and the two others of a like operator. This appears more clearly in a common mathematical representation of the respective inputs and outputs of the operators under consideration.

Thus, considering modules 22, 28 and 30 of the first addition/subtraction operator 36, noting E1 (e) as one of the two inputs of addition module 28, E3 (bd) and E4 (ac) as the two inputs of subtraction module 22, E6 (e) as one of the two inputs of subtraction module 30, S1 (ac−bd+e) as the output of addition module 28, S2 (ac−bd) as the output of subtraction module 22 and S3 (−ac+bd+e) as the output of subtraction module 30, we get the following set of relationships:

$$\begin{cases} S1 = E1 + S2, \\ S2 = E4 - E3, \\ S3 = E6 - S2. \end{cases}$$

If we now consider modules 24, 32 and 34 of the second addition/subtraction operator 38, noting E1 (f) as one of the two inputs of addition module 32, E3 (ad) and E4 (bc) as the two inputs of addition module 24, E6 (f) as one of the two inputs of subtraction module 34, S1 (ad+bc+f) as the output of addition module 32, S2 (ad+bc) as the output of addition module 24 and S3 (−ad−bc+f) as the output of subtraction module 34, we get the following set of relationships:

$$\begin{cases} S1 = E1 + S2, \\ S2 = E4 + E3, \\ S3 = E6 - S2. \end{cases}$$

Now if we consider modules 56, 58 and 60 of the third addition/subtraction 68 operator, noting E1 (Ref-c) and E2 (P1) as the two inputs of addition module 58, noting E5 (Ref-a) and E6 (P0) as the two inputs of addition module 56, S1 (P1+Bm10) as the output of addition module 58, S2 (P0+Bm00−(P1+Bm10)) as the output of subtraction module 60 and S3 (P0+Bm00) as the output of addition module 56, we get the following set of relationships:

$$\begin{cases} S1 = E1 + E2, \\ S2 = S3 - S1, \\ S3 = E5 + E6. \end{cases}$$

Lastly, if we now consider modules 62, 64 and 66 of the fourth addition/subtraction 70 operator, noting E1 (Ref-d) and E2 (P1) as the two inputs of addition module 64, noting E5 (Ref-b) and E6 (P0) as the two inputs of addition module 62, 51 (P1+Bm11) as the output of addition module 64, S2 (P0+Bm01−(P1+Bm11)) as the output of subtraction module 66 and S3 (P0+Bm01) as the output of addition module 62, we get the following set of relationships:

From these three sets of relationships, we can get a fourth one, common to the four aforementioned operators, apart from two binary parameters ($\alpha$ and $\beta$):

$$\begin{cases} S1 = E1 + \alpha E2 + (1-\alpha)S2, \\ S2 = \alpha S3 + (-1)^\beta \alpha S1 + (1-\alpha)E4 + (-1)^\beta (1-\alpha)E3, \\ S3 = E6 + \alpha E5 - (1-\alpha)S2. \end{cases}$$

We obtain the first operator 36 with $(\alpha,\beta)=(0, 1)$, the second operator 38 with $(\alpha,\beta)=(0, 0)$ and the third and fourth operators with $(\alpha,\beta)=(1, 1)$.

From this fourth set of relationships, we can get a common operator containing at a minimum:
one addition hardware module receiving E1 and the output of a multiplexer, controlled as a function of the value of parameter $\alpha$, feeding E2 ($\alpha=1$) or S2 ($\alpha=0$),
one addition/subtraction hardware module (adder for $\beta=0$ and subtractor or $\beta=1$) receiving the output of a first multiplexer, controlled as a function of the value of parameter $\alpha$, feeding S1 ($\alpha=1$) or E3 ($\alpha=0$), and the output of a second multiplexer, controlled as a function of the value of parameter $\alpha$, feeding S3 ($\alpha=1$) or E4 ($\alpha=0$),
one addition/subtraction hardware module (adder for $\alpha=0$ and subtractor or $\alpha=1$) receiving E6 and the output of a multiplexer, controlled as a function of the value of parameter $\alpha$, feeding E5 ($\alpha=1$) or S2 ($\alpha=0$).

More advantageously, the generic operator 72 illustrated in FIG. 7 meets these minimum requirements, but also makes it possible to conceive other applications of arithmetic computations.

It contains six input ports E1, E2, E3, E4, E5 and 6 and three output ports S1, S2 and S3. It furthermore contains a first addition/subtraction module 74 that may be configured as an adder or subtractor depending on a parameter $\beta 1$ (adder if $\beta 1=0$ or subtractor if $\beta 1=1$), receiving E1 and the output of a first multiplexer (80), controlled as a function of the value of a parameter $\alpha 1$, feeding E2 ($\alpha 1=1$) or S2 ($\alpha 1=0$), and feeding S1. It furthermore contains a second addition/subtraction module 76 that may be configured as an adder or subtractor depending on a parameter $\beta 2$ (adder if $\beta 2=0$ or subtractor if $\beta 2=1$), receiving the output of a second multiplexer 82, controlled as a function of the value of a parameter $\alpha 2$, feeding S1 ($\alpha 2=1$) or E3 ($\alpha 2=0$), and the output of a third multiplexer 84, controlled as a function of the value of a parameter $\alpha 3$, feeding E4 ($\alpha 3=1$) or S3 ($\alpha 3=0$), and feeding S2. Lastly, it contains a third addition/subtraction module 78 that may be configured as an adder or subtractor depending on a parameter b3 (adder if $\beta 3=0$ or subtractor if $\beta 3=1$), receiving E6 and the output of a fourth multiplexer 86, controlled as a function of the value of a parameter $\alpha 4$, feeding S2 ($\alpha 4=1$) or E5 ($\alpha 4=0$), and feeding S3.

The parametrizable set of relationships is deduced as follows:

$$\begin{cases} S1 = E1 + (-1)^{\beta 1}[\alpha 1 \cdot E2 + (1-\alpha 1)S2], \\ S2 = [(1-\alpha 3)S3 + \alpha 3 \cdot E4] + (-1)^{\beta 2}[\alpha 2 \cdot S1 + (1-\alpha 2)E3], \\ S3 = E6 + (-1)^{\beta 3}[(1-\alpha 4)E5 - \alpha 4 \cdot S2]. \end{cases}$$

By working with the seven aforementioned binary parameters ($\alpha 1$, $\alpha 2$, $\alpha 3$, $\alpha 4$, $\beta 1$, $\beta 2$, $\beta 3$), it is possible not only to obtain the configurations for operators 36, 38, 68 and 70, but even more configurations that can be used to process other computations than the aforementioned FFT and Viterbi computations.

It should be noted that in practice, it is necessary to introduce memorization elements at the outputs and/or inputs of the adder/subtractor units to resolve non-determination situations produced by feedback loops.

Figure 8:
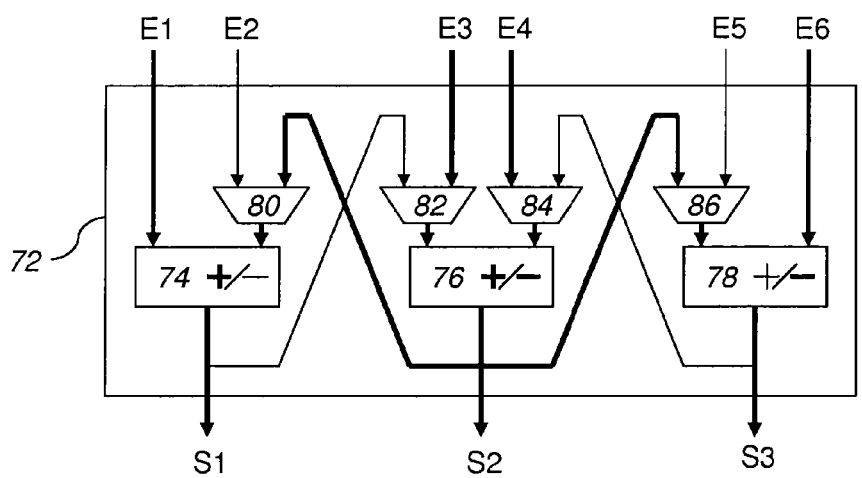

Thus, as shown in FIG. 8, where ($\alpha 1$, $\alpha 2$, $\alpha 3$, $\alpha 4$, $\beta 1$, $\beta 2$, $\beta 3$)=(0, 0, 1, 1, 0, 1, 1) or (0, 0, 1, 1, 0, 0, 1), the generic operator 72 behaves respectively as operator 36 or 38.

As shown in FIG. 9, where ($\alpha 1$, $\alpha 2$, $\alpha 3$, $\alpha 4$, $\beta 1$, $\beta 2$, $\beta 3$)=(1, 1, 0, 0, 0, 1, 0), the generic operator 72 behaves as operator 68 or 70.

In addition, as an example and as shown in FIG. 10, where ($\alpha 1$, $\alpha 2$, $\alpha 3$, $\alpha 4$, $\beta 1$, $\beta 2$, $\beta 3$)=(1, 0, 1, 0, $\beta 1$, $\beta 2$, $\beta 3$), whatever the binary values of $\beta 1$, $\beta 2$, $\beta 3$, the generic operator 72 carries out several—in this case, three—independent addition and/or subtraction operations:

$$E1+/-E2=S1, E3+/-E4=S2, E5+/-E6=S3.$$

Lastly, as an example and as shown in FIG. 11, where ($\alpha 1$, $\alpha 2$, $\alpha 3$, $\alpha 4$, $\beta 1$, $\beta 2$, $\beta 3$)=(1, 1, 1, 1, $\beta 1$, $\beta 2$, $\beta 3$), whatever the binary values of β1, β2, β3, the generic operator 72 carries out several—in this case, three—cascade addition and/or subtraction operations:

$$[(E1+/-E2)+/-E4]+/-E6.$$

We note that there is indeed a minimal parameterization possible for the generic operator 72 using two binary parameters α and β when noting the correlation between coefficients α1, α2, α3, α4, β1, β2, β3 in the four minimal required configurations that are operators 36, 38, 68 and 70. Indeed, in these four configurations, (α1, α2, α3, α4, β1, β2, β3)=(α, α, 1-α, 1-α, 0, β, 1-α), with, as indicated previously, (α,β)=(0, 1) for the first operator 36, (α, β)=(0, 0) for the second operator 38 and (α,β)=(1, 1) for the third and fourth operators 68 and 70.

From the generic operator 72, it is possible to conceive a processor for processing digital data containing at least one parametrizable common butterfly operator (using at least the parameters α and β) that is capable of executing a fast Fourier transform computation in a first configuration and a computation of branch metrics values and of path metrics and survivors values of a Viterbi algorithm implementation in a second configuration, through the pooling of at least one operator such as operator 72 to carry out the functions of operators 36, 38, 68 and 70.

While FFT and Viterbi algorithms are different both regarding the data they process and the functions they perform, pooling the subtraction and/or addition modules using operators such as operator 72 and conceiving a common structure for them is possible through the original exploitation of a similarity in functioning of butterfly operators that they implement.

In terms of hardware complexity, a generic operator such as operator 72 is equivalent to any of the operators 36, 38, 68 or 70. It is therefore possible to confer a "generic" character to a data processor by implementing the generic operator in the stead of operators 36, 38, 68 and 70 that are specific to an FFT or Viterbi algorithm.

Furthermore, use of this generic operator can result in a saving in complexity by reducing hardware resources that are actually put into service. Consider the maximum number of butterfly operators required by current standards and a percentage of each butterfly operator, with this percentage representing the rate of parallel usage, i.e. the number of operators actually put into use. It is possible to calculate potential achievable saving for a pair of percentages relating to FFT and Viterbi algorithms by replacing specific addition/subtraction operators with the aforementioned generic operator in a quantity equal to the maximum number of operators necessary for one or the other of the two algorithms.

Thus the genericity of operator 72 will ensure that the breakdown among the various butterfly operators is accomplished optimally for handling FFT and Viterbi algorithms. The achieved saving will depend on the degree of parallelism of the operators being replaced. If parallelism is high for initial Viterbi butterfly operators, saving will be low, as per the last line of the table. If parallelism is high for FFT butterfly operators, saving will be more substantial, as per the last column of the table.

Another advantage of the generic operator 72 is to be able to profit, in the Viterbi mode, by the fact that data processed in the FFT mode must be complex and that their real or imaginary parts are generally integer numbers. In the Viterbi mode the processor is then able to function as well with hard input data (binary) as with soft data (complete).

In view of the variability of microelectronics technologies performance, it is advantageous to offer the most consistent basic operators/processors possible. In fact, it is conceivable to install extra processors of this kind and to configure them after the fact depending on performance or breakdowns experienced in each of the processors. Consequently, a processor including at least one generic operator 72 as previously described is advantageously integrated into a multi-carrier modulation/demodulation terminal 88 for both received and emitted signals and that can decode signals processed by a convolutional code as illustrated in FIG. 12.

The applications of one processor with at least one such generic operator and at least two modes for handling both FFT and Viterbi functions are multiple, for either single or multi-standards terminals. In fact, many standards implement an OFDM modulation for FFT computations and require decoding of signals processed a convolutional code by means of the Viterbi algorithm, including the following:

Land-based DAB digital radio broadcasting,
Land-based digital video broadcasting (DVB-T and DVB-H),
Land-based DMB-T digital radio broadcasting,
DRM digital radio broadcasting,
Wired links: ADSL, VDSL, modem power line communications (Homeplug), modem cable (Docsis standard),
Wireless networks based on the following standards: 802.11a, 802.11g (Wi-Fi), 802.16 (WiMAX) and HiperLAN,
New generation 4G mobile networks, Naturally, this list is non-limitative, since the quasi-totality of current or in progress standards use OFDM modulation and/or Viterbi decoding processes.

Furthermore, recent work has shown that FFT could be applied in operations more diversified than simple modulation. It can notably be used for correlation calculations, development of FIR filters, channel estimates or detection of several users. Likewise, use of the Viterbi algorithm has extended to decoding Turbo Codes.

Thus, the proposed generic operator 72 can be used for a majority of mono or multi-standards telecommunication terminal functions. It facilitates their integration by implementing homogenous processing units that contain configurable generic operators.

It should be noted that the invention is not limited to the conceived embodiments. It will be clear to a person skilled in the art that diverse modifications may be made to the embodiment described above in view of the information here revealed. In the claims below, the terms used should not be interpreted as limiting the claims to the embodiments presented in this description, but should rather be interpreted to include herein all the equivalents that the claims seek to cover through their formulation and which can be anticipated by persons skilled in the art by applying their general knowledge to implementing the information here revealed.

The invention claimed is:

1. An addition/subtraction hardware operator, comprising:
a plurality of no more than three addition/subtraction hardware modules; and
a plurality of transmission links between the modules, on one hand, and between inputs and outputs of the operator and the modules, on the other hand, according to a predetermined structure for performing arithmetical calculations,
wherein at least a part of the addition/subtraction hardware modules and at least a part of the links between the modules can be configured by at least one programmable parameter, at least between a first configuration in which the operator finalizes a computation of real parts of fast Fourier transform coefficients, a second configuration in which the operator finalizes a computation of imaginary parts of fast Fourier transform coefficients, a third configuration in which the operator carries out a computation of path metrics and survivors values of a Viterbi algorithm implementation, a fourth configuration in which the operator carries out several independent addition and/or subtraction operations, or a fifth configuration in which the operator finalizes a cascade of three sequential addition and/or subtraction operations, and wherein the addition/subtraction hardware operator further comprises:

a first addition/subtraction hardware module that is configurable by means of a first binary parameter between an adder configuration and a subtractor configuration;

a second addition/subtraction hardware module that is configurable by means of a second binary parameter between an adder configuration and a subtractor configuration;

a third addition/subtraction hardware module that is configurable by means of a third binary parameter between an adder configuration and a subtractor configuration;

first link for furnishing an operand value to the first configurable module, through a first multiplexing parameter, between a configuration for providing input data of the operator and a configuration for providing the output of the second configurable module;

a second link for furnishing a first operand value to the second configurable module, through a second multiplexing parameter, between a configuration for providing input data of the operator and a configuration for providing the output of the first configurable module;

a third link for furnishing a second operand value to the second configurable module, through a third multiplexing parameter, between a configuration for providing input data of the operator and a configuration for providing the output of the third configurable module; and a fourth link for furnishing an operand value to the third configurable module, through a fourth multiplexing parameter, between a configuration for providing input data of the operator and a configuration for providing the output of the second configurable module, wherein each configurable link contains a dual input multiplexer with a single output and with a selection of one of the two inputs using a binary parameter, such that the addition/subtraction hardware operator includes no more than four dual input multiplexers and the three addition/subtraction modules for causing the addition/subtraction hardware operator to be configured between the first, second, third, fourth, or fifth configurations.

2. A processor for processing digital data, comprising:
at least one butterfly operator including at least one addition/subtraction hardware operator according to claim 1, the butterfly operator being configurable by means of the said programmable parameter, between a first configuration in which the butterfly operator carries out a fast Fourier transform computation and a second configuration in which it carries out a computation of branch metrics values and of path metrics and survivors values of a Viterbi algorithm implementation.

3. The processor for processing digital data according to claim 2, further comprising:
a plurality of butterfly operators that can be configured between the said first configuration in which each butterfly operator carries out the said fast Fourier transform computation and the said second configuration in which each butterfly operator carries out a computation of branch metrics values and of path metrics and survivors values of a Viterbi algorithm implementation, the butterfly operators being structured among themselves such that they can perform a fast Fourier transform computation by means of a trellis structure Cooley-Tukey algorithmic approach of the Radix 2 type, and a trellis implementation of the Viterbi algorithm with four reference symbols.

4. A telecommunication terminal with multi-carrier modulation/demodulation of both received and emitted signals, that decodes signals processed by means of a convolutional code, comprising:
at least one addition/subtraction hardware operator according to claim 1.

5. The telecommunication terminal according to claim 4, wherein an OFDM modulation/demodulation is implemented.

6. The telecommunication terminal according to claim 5, wherein the terminal is of a multi-standards type, and includes at least one modulator/demodulator for OFDM modulation and demodulation compatible with each implemented standard, and at least one decoder for signals encoded by a convolutional code compatible with each implemented standard.

* * * * *